United States Patent [19]

Heng et al.

[11] 4,070,652

[45] Jan. 24, 1978

[54] ACOUSTO-ELECTRIC SIGNAL CONVOLVER, CORRELATOR AND MEMORY

[75] Inventors: Terrance M. S. Heng, Plum Borough; Harvey C. Nathanson, Pittsburgh; Dieter K. Schroder, Wilkins Township; Paul R. Malmberg, Edgewood Borough, all of Pa.

[73] Assignee: Westinghouse Electric Corporation, Pittsburgh, Pa.

[21] Appl. No.: 631,970

[22] Filed: Nov. 14, 1975

[51] Int. Cl.[2] ........................ H01L 41/10; G06G 7/19

[52] U.S. Cl. ................................ 365/157; 333/30 R; 333/72; 365/149; 364/821; 364/862

[58] Field of Search ............... 235/181; 333/30 R, 72; 310/8.1; 340/173 R, 173 MS, 173 PP, 173 CA; 357/13, 51, 23

[56] References Cited

U.S. PATENT DOCUMENTS

| | | | |
|---|---|---|---|
| 3,836,992 | 9/1974 | Abbas et al. | 357/23 |
| 3,906,296 | 9/1975 | Masertian et al. | 340/173 CA |
| 3,909,119 | 9/1975 | Wolley | 357/13 |
| 3,935,564 | 1/1976 | Quate et al. | 340/173 R |
| 3,952,325 | 4/1976 | Beale et al. | 340/173 R |
| 3,953,836 | 4/1976 | Kantorowicz | 340/173 MS |
| 3,974,486 | 8/1976 | Curtis et al. | 340/173 R |
| 3,975,696 | 8/1976 | Kantorowicz | 333/30 R |
| 3,990,099 | 11/1976 | Duigon et al. | 357/13 |
| 3,992,701 | 11/1976 | Abbas et al. | 340/173 R |
| 4,016,412 | 4/1977 | Stern et al. | 235/181 |

OTHER PUBLICATIONS

Maerfeld et al., Acoustic Storage and Processing Device Using p-n Diodes, Applied Physics Letters, vol. 27, No. 11, Dec. 1975.

Ingebrigtsen, Simultanous Storage of Spatially Orthogonal Acoustic Beams, Electronics Letters, Nov. 27, 1975, vol. 11, No. 24.

Bert et al., Phase and Amplitude Storage of an Acoustic Signal, Electronics Letters, Oct. 16, 1976, vol. 11, No. 21.

*Primary Examiner*—Felix D. Gruber
*Attorney, Agent, or Firm*—H. W. Patterson

[57] ABSTRACT

An acousto-electric device provides a memory for a reference signal and provides for the convolution or correlation of input signals with the reference signal. The reference signal is transduced onto a piezoelectric surface to estabiish an electric field which determines the transfer and recombination of minority carriers across the p-n junction matrix of an adjacent semiconductor thereby creating a space-charge region in the semiconductor which is a spatial replication of the reference signal. The signal may be recovered in relation to the amplitude modulation of a carrier signal. For correlation or convolution of the reference signal with input signals, the input signals are provided to first or second terminals respectively and transduced onto the piezoelectric surface to produce electric fields which interact with the space-charge region of the stored reference signal to provide a product current whose integration comprises the correlation or convolution output.

24 Claims, 9 Drawing Figures

ACOUSTO-ELECTRIC SIGNAL CONVOLVER, CORRELATOR AND MEMORY

BACKGROUND OF THE INVENTION

1. Field of the Invention

The invention relates to acousto-electric devices which may be used to perform memory, correlation or convolution operations.

2. Description of the Prior Art

One approach to convolution and correlation of an input signal with a reference signal has been to transduce the signals onto a piezoelectric surface and integrate the electric fields of the resulting acoustic waves in an adjacent semiconductor. The acoustic wave of the reference signal propagates from a reference transducer along the piezoelectric surface giving rise to normal and tangential electric fields. At the same time, the acoustic wave of the input signal is launched from an input transducer in the opposite direction to the reference wave. The normal component of the electric fields produced by the waves accumulate electrons in the adjacent semiconductor in a non-linear manner to produce a current proportional to the product of the local amplitude of the two signals. A summing electrode on the back surface of the semiconductor integrates the current over the interaction interval to produce an output proportional to the convolution of the two surface wave signals. Correlation of the input signal with the reference signal may be accomplished in substantially the same manner provided the input signal is first time inversed. The disadvantages of this approach are: that the reference wave must be periodically introduced; that the output is compressed in time by a factor of two; and that, for correlation, the input wave must be time inversed. As recognized in a technical paper entitled "New Adaptive-Signal-Processing Concept" by E. Stern and R. C. Williamson in Volume 10, Number 5 of Electronic Letters, these disadvantages can be eliminated by storing the reference wave in a suitable memory device.

In the prior art, memory devices have been proposed which store a reference signal in surface states of a semiconductor. Publications which have discussed this technique include: "Surface State Memory in Surface Acoustoelectric Correlator" by A. Bers and J. H. Cafarella in Applied Physics Letters, Volume 25, Number 3; and "Storage of Acoustic Signals in Surface States in Silicon" by H. Hayakawa and G. S. Kino in Applied Physics Letters, Volume 25, Number 4. The reference wave is transduced onto a piezoelectric surface where it forms an acoustic wave which propagates along the piezoelectric surface. When the acoustic wave is opposite the semiconductor, the semiconductor is excited by a short "write" pulse. This causes the normal electric field components of the piezoelectric surface wave to attract electrons to the adjacent semiconductor surface where they are captured by surface states. The captured electrons create a space-charge pattern at the semiconductor surface which is a spatial replica of the reference wave. The reference signal is retrieved by convolving a carrier wave and a read pulse which have been transduced onto the piezoelectric material. The reference signal is the amplitude modulation of the carrier wave which is provided at the output of the summing electrode attached to the semiconductor. Using this acousto-electric device, a real-time convolution of the stored reference signal with an input signal is obtained at the output of the summing electrode by transducing the input wave onto the piezoelectric surface so that it propagates in the same direction as the reference wave. A real-time correlation of the reference signal and an input signal is obtained, without time inversion of either signal, by transducing the input wave onto the piezoelectric surface so that it propagates in the opposite direction from the reference wave. Real-time convolution and correlation of the input and reference waves may be accomplished in this manner as long as the stored reference wave persists.

The reference signal storage time of these prior art devices is determined by the thermal emission of the trapped electrons from the surface states. When a large time-bandwidth product is required as, for example, in real-time matched filter radar applications, the ratio of storage time to writing time should be $10^6$. Storage of the reference signal in surface states, however, provides a storage to writing-time ratio of only $10^4$. For these large time-bandwith applications there is, therefore, a need for a device which would provide longer reference signal storage times. In relation to this problem, a publication entitled "A Schottky-Diode Acoustic Memory and Correlator" by K. A. Ingebrigtsen, R. A. Cohen and R. W. Mountain appeared on June 1, 1975 in Applied Physics Letters Volume 26, Number 11. A device according to such publication has a relatively low barrier, high leakage current, and short storage time.

SUMMARY OF THE INVENTION

Apparatus is disclosed for storing reference signals in a semiconductor and for convolving and correlating input signals with the stored reference signals. The semiconductor is provided with an array of diode junctions which may be comprised of the interface between p type and n type materials. The reference signal is transduced onto a piezoelectric surface adjacent to the semiconductor where it is propagated as an acoustic wave which gives rise to electric field components which are normal and tangential to the piezoelectric surface. The semiconductor is excited by a forward bias pulse which temporarily lowers the potential barrier of the diode junctions, such that the normal electric field components of the acoustic wave cause the transfer of minority carriers across the junctions. After crossing the junctions, these carriers recombine so that, after the bias pulse is removed and the potential barrier restored, a space-charge region is formed which is a spatial replica of the acoustic wave. As an alternative to a single forward bias pulse, a radio frequency pulse train having a period substantially equal to the period of the reference signal may be used to improve accuracy in the storage of the reference signal. When the disclosed apparatus is operated as a memory, the reference signal is retrieved by convolving a carrier wave and a "read" pulse which have been transduced onto the piezoelectric material. The reference signal is the amplitude modulation of the carrier wave which is provided at the output of a summing electrode attached to the semiconductor. When the disclosed apparatus is operated as a convolver, a real-time convolution of the stored reference signal with an input signal is obtained at the output of the summing electrode by transducing the input wave onto the piezoelectric surface so that it propagates in the opposite direction from the reference wave. When the disclosed apparatus is operated as a correlator, a real-time correlation of the reference signal and an input signal is obtained by transducing the input wave onto the piezoelectric surface so that it propagates in the same direction as the reference wave. The stored reference signal can be erased by pulsing light on the semiconductor to generate electron-hole pairs which will collapse the space-charge region. Alternatively, erasure may be accomplished by providing the semiconductor with a second diode junction and biasing this junction to inject the necessary carriers into the semiconductor to collapse the space-charge region.

In an alternative embodiment, the reference signal is stored as a space-charge region in a semiconductor which is not adjacent to the piezoelectric surface. The normal component of the acoustic wave electric field is collected by a first array of metal electrodes and transferred across respective electrical conductors to a second array of metal electrodes located adjacent to the semiconductor. The reference signal is stored as a space-charge region formed about a matrix of diode junctions in the semiconductor in relation to the electric field provided by the second array of electrodes. As a third embodiment, the second array of electrodes and semiconductor of the alternative embodiment may be replaced by a metal-oxide-silicon capacitor in which the reference signal is stored as a pattern of localized charge carriers distributed in relation to the potential of the metal capacitor plate.

DESCRIPTION OF THE PREFERRED EMBODIMENT

Figure 1:
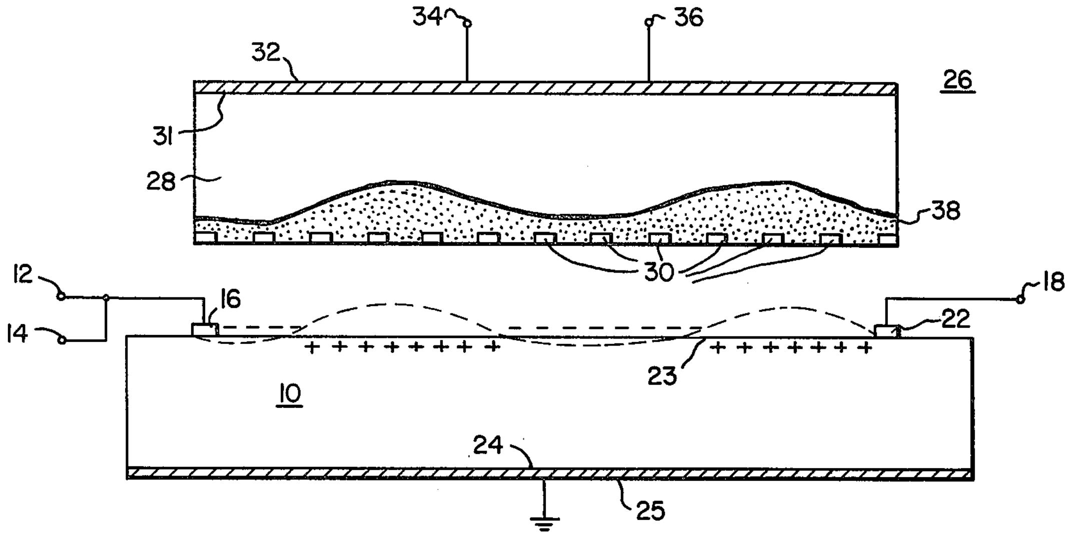
FIG. 1 shows a cross-section of the disclosed acousto-electric device comprised of a piezoelectric substrate and a semiconductor material with an illustrated space-charge region corresponding to a reference wave.

FIG. 1 shows a cross-section of the preferred embodiment of the disclosed acousto-electric signal memory correlator and convolver. The disclosed device includes a piezoelectric substrate 10 which, for example, could be comprised of $LiNbO_3$ or an equivalent material. Correlator input terminal 12 and reference input terminal 14 are electrically coupled to transducer 16 and convolver input terminal 18 is electrically coupled to transducer 22. Transducers 16 and 22 are fixed to the surface 23 of substrate 10. The surface 24 of substrate 10 is covered by an electrically grounded metal base 25, which may be comprised of aluminum.

Closely adjacent to the surface 23 of substrate 10 is semiconductor 26 comprised of a p type material 28 and a diode matrix of n+ type material 30 with the n+ type matrix 30 closest to surface 23 of substrate 10. The center-to-center spacing between members of n+ matrix 30 should be no larger than one-eighth the acoustical surface wavelength associated with the highest frequency of interest in the piezoelectric material. P type material 28 may be comprised of silicon doped with a concentration of boron of approximately $10^{16}cm^{-3}$ and n+ type matrix 30 may be comprised of silicon doped with a concentration of phosphorus of approximately $10^{20}cm^{-3}$. As explained later, p type material 28 is also provided with a predetermined concentration of a recombination impurity which, for example, may be gold. As is well known in the art, posts may be formed on the surface 23 of substate 10 by ion-beam etching to maintain an air gap between semiconductor 26 and substrate 10 which, typically, is from 500 to 10,000 Angstroms wide. This distance has been greatly exaggerated in FIG. 1 for clarity. The surface 31 of semiconductor 26 is covered by a summing electrode 32 to which a write input terminal 34 is electrically connected. Summing electrode 32, which may be comprised of aluminum, integrates the total charge of semiconductor 26 and provides this to memory-convolution-correlation output terminal 36.

For the memory of a reference signal or as the first step in either convolution or correlation of an input signal with the reference signal, the reference signal is stored as a space-charge region 38 in the semiconductor 26. This is accomplished by providing the reference signal to reference input terminal 14. From input terminal 14, the reference signal is transferred to transducer 16 attached to piezoelectric substrate 10. At transducer 16, the electric field of the reference signal physically distorts the crystalline structure of the piezoelectric substrate 10 so that the reference signal is transformed into an acoustic waveform which propagates from left to right across the surface 23 of piezoelectric substrate 10, as illustrated by the dashed line of FIG. 1. The distortions in the crystalline structure which comprise the acoustic waveform cause electrostatic charges to appear at the surface of the piezoelectric substrate 10 as also illustrated in FIG. 1. These electrostatic charges create an electric field having a component whose direction is normal to the surface 23 of piezoelectric substrate 10, and whose sense is dependent upon the polarity of the electrostatic charges developed by the acoustic wave. The electric field created by the surface charges of the piezoelectric material 10 create a space-charge region 38 in the p-type material 28 and n+ type material 30 of semiconductor 26 which is a spatial replica of the acoustic wave as illustrated in FIG. 1 and as will be explained in relation to FIGS. 2 and 3.

Figure 2A:
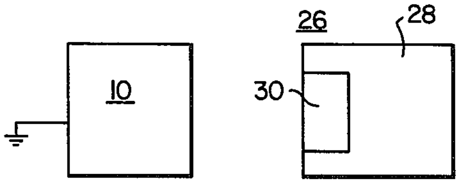
FIGS. 2A through 2D illustrate the operation of the disclosed device in terms of energy band diagrams.
Figure 2B:
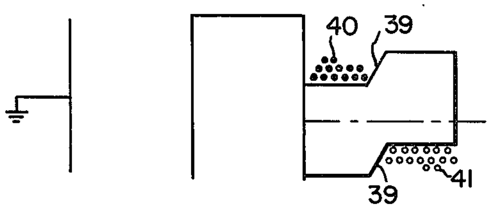
Figure 2C:
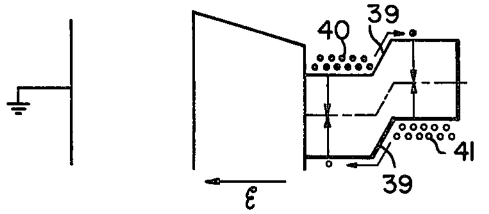

The basic principle of the storage of the reference signal is explained in relation to FIGS. 2A through 2D. FIG. 2A shows the physical arrangement of substrate 10 and semiconductor 26, and FIG. 2B shows the energy band diagram of semiconductor 26 with no external electric fields applied. As can be seen from FIGS. 2A and 2B, the interface of p type material 28 and n+ type material 30 provides a diode junction having an electrical potential barrier 39. Under equilibrium conditions, this potential barrier 39 prevents a net transfer of electrons 40 from n+ type material 30 to p type material 28 and also prevents a net transfer of holes 41 from p type material 28 to n+ type material 30. A positive write pulse is applied to input terminal 34 while the reference acoustic wave is traveling between the substrate 10 and semiconductor 26, such that the electric field due to the surface voltage on the piezoelectric surface 23 is sufficient to cause electrons 40 to be injected from the n+ type material 30 into the p type material 28 and holes 41 to be injected from the p type material 28 into the n+ type material 30 in relation to the electric field strength. These injected electrons 40, which are minority carriers in p type material 28, and holes 41, which are minority carriers in n+ type material 30, will recombine with holes and electrons respectively as shown by the arrows in FIG. 2C. When the positive write pulse is removed from input terminal 34, the electric field of the surface 23 of piezoelectric substrate 20 is no longer sufficiently strong to affect the electron and hole distribution in semiconductor 26 so that, in comparison to thermal equilibrium conditions, there will be a deficiency of carriers in both the p type material 28 and the n+ type material 30 and hence a depletion or space-charge region is formed. Since each element of n+ type matrix 30 is subject only to the local electric field of the acoustic wave, the space-charge region forms a spatial replica of the acoustic wave.

An alternative to the write pulse applied to terminal 34 is to use a radio frequency pulse train whose frequency is equal to the frequency of the reference wave propagating along the piezoelectric substrate 10. The use of the radio frequency pulse train provides a more faithful reproduction of the reference wave in the space-charge region 38 by permitting many repeated interactions of the electric field of the acoustic reference wave and the electrons 39 and holes 40 in semiconductor 26.

Figure 2D:
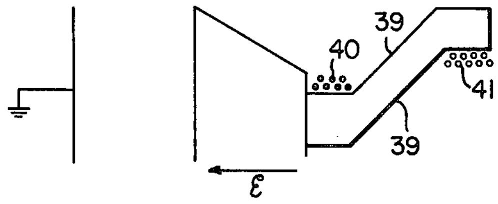

In terms of energy levels, the junction of materials 28 and 30 becomes reverse biased in relation to ground potential, as shown in FIG. 2D. As the electron and hole concentrations in p and n materials 28 and 30 return to thermal equilibrium, the space-charge reference pattern deteriorates. However, this stored potential pattern will exist for a sufficiently long time to perform memory, correlation and convolution operations. If necessary, the reference signal can be reset from a new reference wave and "write" pulse. The heavy concentration of electrons in the n+ type material 30 causes rapid recombination of the holes from p type material 28 and prevents the space-charge region 38 from being affected by the surface states of the silicon. Therefore, the bulk effect of materials 28 and 30 determines the space-charge region of the reference signal and not the surface states.

The acousto-electric device of FIG. 1 may be operated as a memory so that the reference signal stored as the variation of space-charge region 38 along the length of the semiconductor 26 may be retrieved. The reference signal is obtained as the amplitude modulation of a carrier signal. Two acoustic pulses of substantially the same frequency, one of which is a short memory pulse and the other a carrier signal of relatively long duration, are transduced onto piezoelectric substrate 10 in relation to signals provided to input terminals 14 and 18, respectively. The electric fields of the acoustic memory and carrier pulses will interact with the electric field of the space-charge region representing the stored reference signal to provide a signal having twice the frequency of the input pulses at terminal 36. The stored reference signal will appear as the amplitude modulation of the carrier pulse applied to terminal 18.

For real-time convolution of the stored reference signal with an input signal, the input signal is applied through input terminal 18 to transducer 22. At transducer 22 the electric field of the input signal forms an acoustic wave which propagates from right to left along the surface 23 of piezoelectric substrate 10 of FIG. 1. In substantially the same manner as with the previously discussed reference wave, the acoustic wave formed by the input signal creates an electric field having a component which is normal to surface 23 of piezoelectric substrate 10. Because there is no write pulse applied to terminal 34, the electric field of the acoustic wave of the input signal is not strong enough to cause the transfer of minority carriers across the potential barrier of the p-n junction. However, the electric field of the input wave combines with the electric field of the reference wave stored in the space-charge region 38 of semiconductor 26 such that their product is provided to output terminal 36 by summing electrode 32. The output of terminal 36 therefore provides the convolution of the input and reference signals as long as the space-charge region 38 continues to exist.

Real-time correlation of the stored reference signal with an input signal may be achieved in substantially the same manner except that the input signal is provided to transducer 16 through input terminal 12. At transducer 16 the electric field of the input signal forms an acoustic wave which propagates from left to right along the surface 23 of piezoelectric substrate 10 of FIG. 1. The electric field of the input wave combines with the electric field of the reference wave stored in the spaccharge region 38 of semiconductor 26 and their product is provided by summing electrode 32 to output terminal 36. A correlation peak is obtained for waveforms substantially identical to the stored reference wave as long as the space-charge region 38 continues to exist.

The disclosed acousto-electric device is capable of providing high storage-to-writing time ratios for large time-bandwidth applications. The writing time, or the time required for storing the reference wave, is the time required for the injected minority carriers to recombine and hence is the recombination lifetime, $t_r$. The storage time, or the time for which the reference signal can be stored is $t_s$, the time in which an open-circuited, reverse-biased p-n junction returns to thermal equilibrium as a result of thermal generation. $t_s$ may be determined from the relationship:

$$t_s = (N_A/n_i)\, t_g \quad (1)$$

where: $N_A$ is the dopant concentration of the p-type material; $n_i$ is the intrinsic carrier concentration of silicon, and $t_g$ is the generation lifetime of the minority carriers. $t_g$ may be determined from the relationship:

$$t_g = t_r e^{(E_T - E_i)/kT} \quad (2)$$

where:

$k$ is Boltzmann's constant;
$T$ is the absolute temperature;
$E_i$ is the intrinsic energy level of undoped silicon;
$E_T$ is the energy level of the recombination impurity; and $(E_T - E_i)$ is the energy level of the recombination centers from midgap.

For an estimate of the storage to writing time ratio, the shortest storage time will occur when $E_T$ equals $E_i$. If the case of $E_T$ equal to $E_i$ is assumed, from equation (2) we see that:

$$t_g = t_r \quad (3)$$

Substituting equation (3) in equation (1), the ratio of storage time to writing time is:

$$t_s/t_r = N_A/n_i \quad (4)$$

Equation (4) illustrates that, for a given intrinsic carrier concentration, $n_i$, the storage to writing time ratio of the disclosed device can be determined by the choice of dopant concentration $N_A$. For example, in silicon at room temperature $n_i$ equals $10^{10}cm^{-3}$ so that a $t_s/t_r$ ratio of $10^6$ can be obtained if $N_A$ equals $10^{16}cm^{-3}$. If a storage time of $10^{-3}$ sec is acceptable, the recombination lifetime can be reduced by gold doping, according to the relation $t_r = 10^7/N_A$ where $N_A$ is the dopant concentration. A writing time of $10^{-9}$ sec is realized if the dopant concentration is $10^{16}cm^{-3}$, a concentration easily achieved.

Figure 3:
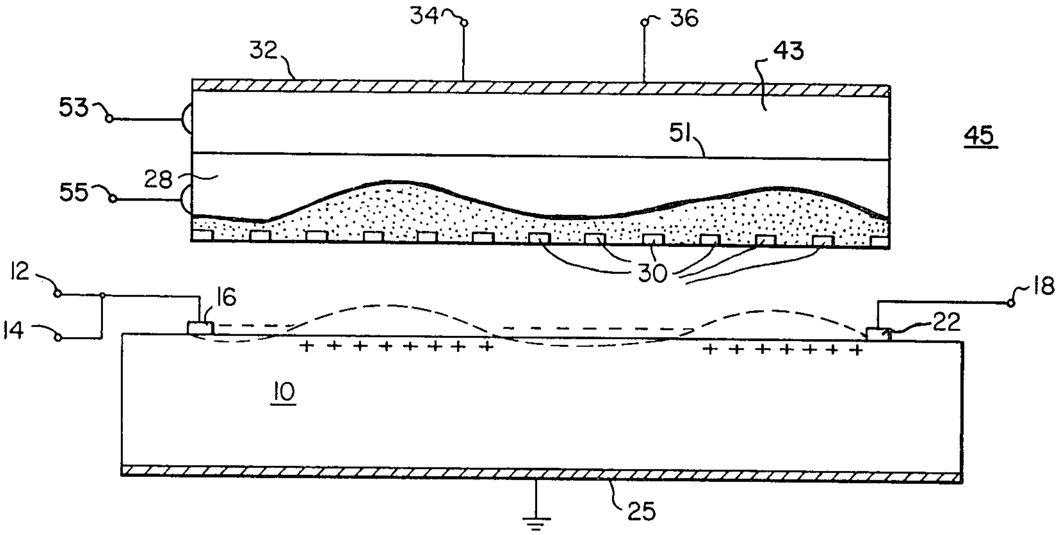
FIG. 3 shows an acousto-electric device having a semiconductor provided with a second p-n junction which may be biased to erase a stored signal.

Equations (1) and (2) also show that the $t_s/t_r$ ratio can also be varied by choosing recombination impurities in relation to their energy levels. Equation (2) shows that if recombination impurities are chosen having energy levels different from $E_i$, $t_g$ will be different from $t_r$. For example, for $E_T - E_i = 4$ kT, $t_g = 50\ t_r$, and $t_s/t_r = 50\ N_A/n_i$. Therefore, the disclosed embodiment provides two methods for establishing a predetermined $t_s/t_r$ ratio, by controlling the doping concentration, $N_A$, and by controlling the energy level $E_T$ of the recombination impurity.

Where the concentration of the recombination impurity is sufficiently high, the resistivity of semiconductor 26 will have a tendency to limit the frequency range of the disclosed acousto-electric device. To avoid this complication, semiconductor 26 may be provided with a n+ type substrate 43 as shown in FIG. 3 to form semiconductor 45. n+ type substrate 43 may be comprised of silicon doped with a concentration of phosphorous. Semiconductor 45 is produced by growing a thin layer of about five microns of p-material 28 on n+ type substrate 43 and then diffusing n+ type matrix 30 into p-material 28. This structure improves the quality factor of diode junctions between p type material 28 and n+ type material 30, particularly for gigahertz frequencies. When the recombination impurity is diffused into the p type substrate 28, it will not proceed into n+ type substrate 43 thereby limiting the resistivity of the semiconductor 45 and the resultant effect on frequency range of the disclosed acousto-electric device.

Before a new reference signal can be stored in the disclosed device, the existing reference space-charge pattern must be erased. In FIG. 3, p type portion 28 is provided with a heavily doped n+ substrate 43 which forms a p-n junction 51 with p type material 28. A negative erase pulse is provided across terminals 53 and 55 to forward bias the p-n junction 51 and inject the mobile electron carriers necessary to bring the space-charge region to zero bias.

Figure 4:
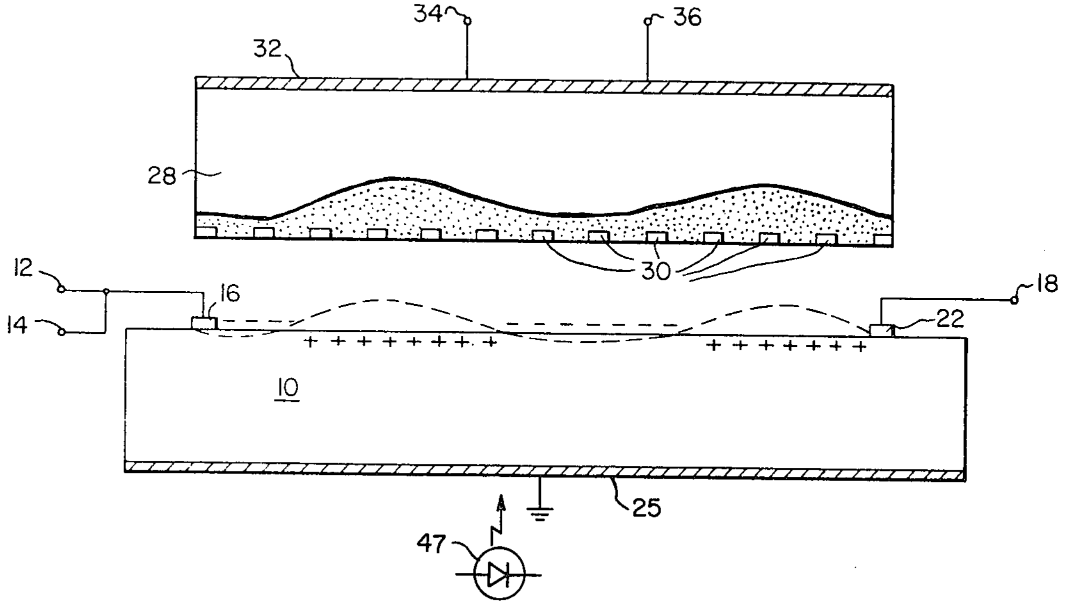
FIG. 4 illustrates a photoelectric method for erasing the stored signal.

An alternative device for erasing the reference space-charge region 38 is shown in FIG. 4. Since the wavelength of a light source such as GaAs light emitting diode 47 to which the piezoelectric substrate 10 is transparent, corresponds to peak absorption in the silicon, the erase operation which is required to prepare the device for the next reference input, may be performed by the apparatus shown in FIG. 4. GaAs light emitting diode 47 is pulsed on and the incident light focused on p type material 28 to generate electron-hole pairs in the silicon. The generation of these charge carriers causes the collapse of the reference space-charge region 38.

Since no external light source is required, the method of FIG. 3 is simpler to implement than the method of FIG. 4. Another advantage of the apparatus of FIG. 3 is that it is not restricted by the frequency limitations of resolving light into discrete pulses and is therefore capable of higher operating frequencies than the apparatus of FIG. 4.

Figure 5:
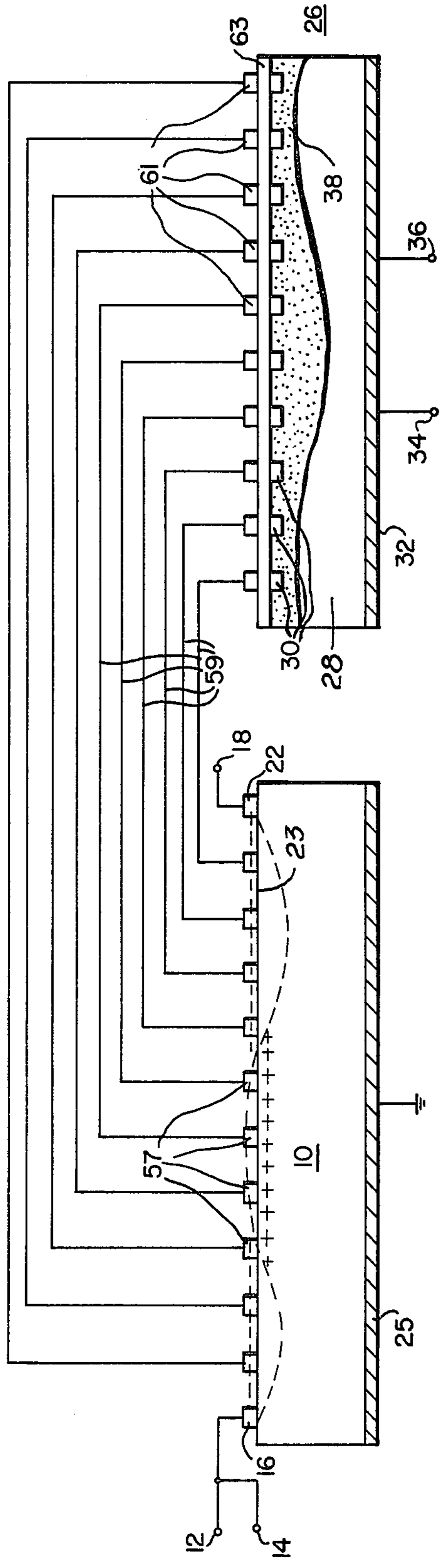
FIG. 5 shows an embodiment where the piezoelectric substrate and semiconductor material are physically separated and are coupled through metal electrode arrays joined by electrical conductors.

FIG. 5 shows a modification of the acousto-electric device of FIG. 1. In FIG. 5, instead of a closely spaced geometry between the piezoelectric substrate 10 and the semiconductor 26, with the space-charge region depending directly upon the normal component of the electric fields of the piezoelectric material, a multiple of electrical conductors, such as wires 59, are respectively attached to members of a metal electrode array 57 fastened in parallel across the surface 23 of piezoelectric substrate 10. Wires 59 are also attached to respective members of a metal electrode array 61 which is fixed to a silicon dioxide layer 63 covering p and n+ type materials 28 and 30 of semiconductor 26. The voltage developed by the acoustic reference wave is collected by metal electrode array 57 and transferred on wires 59 to electrode array 61. When a write pulse is provided to terminal 34, the voltage developed on the members of electrode array 61 operates through silicon dioxide layer 63 to temporarily forward bias the semiconductor 26 so that when the write pulse is removed, the p-n junction of p type material 28 and n+ type material 30 is in a reverse bias condition similar to the operation of the embodiment of FIG. 1. Silicon dioxide layer 63 insulates n+ type material array 30 from electrode array 61 so that the space-charge region 38 is not affected by voltages on the electrode array 61 in the absence of a write pulse at terminal 34. The embodiment of FIG. 5 eliminates the close spacing between the piezoelectric substrate 10 and semiconductor 26 required in the FIG. 1 embodiment, but does require the presence of electrode array 57 on the piezoelectric substrate 10 which suppresses the acoustic wave and therefore tends to create distortions in the space-charge region 38 which comprises the stored reference signal.

Figure 6:
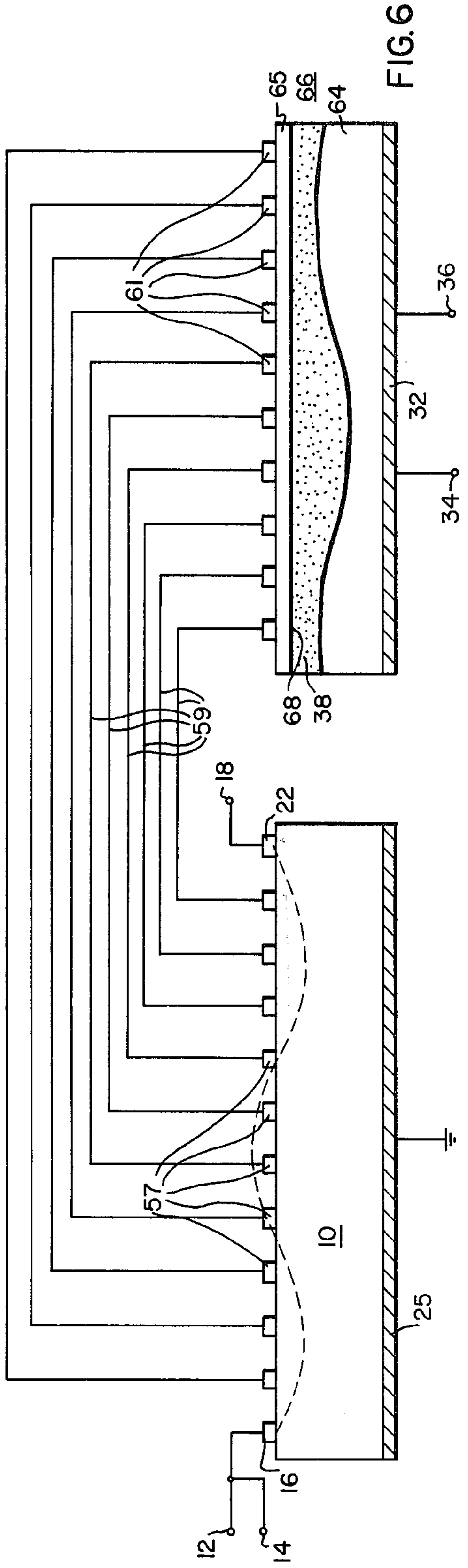
FIG. 6 shows an embodiment in which a metal-oxide-silicon capacitor is substituted for the metal electrode array and semiconductor combination of FIG. 5.

FIG. 6 shows a modification of the embodiment of FIG. 5 in which the silicon semiconductor 26 is replaced by p type material 64 covered by a silicon dioxide layer 65 so that electrode array 61, silicon dioxide layer 65, and p type material 64 combine to respectively form the first plate, dielectric, and second plate of a metal-oxide-silicon capacitor 66. An accumulation layer is developed on surface 68 of p type material 64 by a positive DC bias voltage applied to terminal 34. The reference voltage pulses from the electrode array 57 on piezoelectric substrate 10 are transferred to electrode array 61 over conductors 59 to cause electrons to be injected into the bulk of p type material 64 to recombine there. Termination of the bias voltage on terminal 34 creates a reverse bias condition with substantially the same writing and storage times as those of the p-n junction previously discussed in relation to FIG. 1.

In the embodiments of FIGS. 5 and 6, silicon dioxide layers 63 and 65 act as insulators to prevent coupling of the electric charges of adjacent members of electrode array 61. Such charge coupling would act to average the reference signal of piezoelectric substrate 10. In either of the embodiments of FIGS. 5 and 6, the stored signal may be erased by either an electrical pulse on n+ silicon substrate 43, as shown in FIG. 3 or by a light emitting diode 47, as shown in FIG. 4.

We claim:

1. An acousto-electric device for storing a reference signal in response to a write pulse, said device comprising:

piezoelectric means for providing an electric field in response to said reference signal;

semiconductor means including a first semiconductor material of one semiconductivity type and a second semiconductor material of opposite semiconductivity type to form a matrix of PN junctions, said semiconductor means being responsive to the write pulse and to the electric field of said piezoelectric means to form a space-charge region in said first semiconductor material corresponding to the reference signal upon the termination of the write pulse and an electrode attached to the surface of said first semiconductor material that is oppositely disposed from the PN junction matrix for applying the write pulse to the first material of the one semiconductivity type.

2. The apparatus of claim 1 further comprising:

a reference signal transducer for providing an acoustic wave on the surface of said piezoelectric means in relation to said reference signal; and a ground electrode attached to said piezoelectric means such that the electric field developed by said acoustic wave is relative to ground potential.

3. The apparatus of claim 1 in which said first material is of a P type and said second material is an N+ type.

4. The apparatus of claim 1 further comprising:

erasing means operative with said PN junction matrix for collapsing the space-charge region of said first material.

5. The apparatus of claim 4 in which said erasing means includes a layer of said material of said opposite semiconductivity type disposed between the electrode and a surface of said first material that is oppositely disposed from the PN junction matrix.

6. A device according to claim 1 wherein the material of said one semiconductivity type is P material and the material of said opposite semiconductivity type is N+ material.

7. An acousto-electric memory for providing a memory signal in response to a write pulse, said reference signal comprising:

piezoelectric means for providing an electric field in relation to an acoustic wave;

a first transducer mounted on said piezoelectric means for providing a reference acoustic wave on the surface of said piezoelectric means in response to said reference signal;

a ground electrode attached to said piezoelectric means such that the electric field of the piezoelectric means is relative to ground potential;

semiconductor means including a first material of one semiconductivity type, and a second material of opposite semiconductivity type to form a matrix of PN junctions, said semiconductor means being responsive to the write pulse and to the electric field of said piezoelectric means to form at the termination of the write pulse in said first material a space-charge region corresponding to the reference acoustic wave; and a metallic electrode overlying the surface of said first semiconductor material that is oppositely disposed from the PN junction matrix for applying said write pulse to said semiconductor means.

8. The apparatus of claim 7 further comprising:

a second signal transducer spaced from said first transducer on the piezoelectric means to apply an input to the piezoelectric means in a direction opposite to that of the reference signal for convolving the reference and input signals, and said metallic electrode being operative to provide the convolved output signal.

9. The apparatus of claim 7 further comprising:

erasing means operative with said PN junction array for collapsing the space-charge region of said first semiconductor material.

10. An acousto-electric correlator that is responsive to a write pulse, a reference signal and an input signal for providing the correlation of the reference signal and the input signal, said correlator comprising:

piezoelectric means for providing an electric field in relation to an acoustic wave;

a reference signal transducer mounted on said piezoelectric means for applying acoustic waves on the surface of said piezoelectric means in response to the reference and input signals;

semiconductor means including a first semiconductor material of one semiconductivity type and a second semiconductor material of the opposite semiconductivity type to form a matrix of PN junctions, said semiconductor means being responsive to the write pulse and to the electric field of said piezoelectric means to form a space-charge region in said first semiconductor material corresponding to the reference signal, and a metallic electrode attached to said first semiconductor material that is oppositely disposed from the PN junction matrix, said electrode providing a correlation signal in response to the space-charge region of the first semiconductor material in combination with the electric field of the acoustic wave generated by said reference transducer in response to the input signal.

11. An acousto-electric device for processing and storing a reference signal in response to a write signal, comprising:

a piezoelectric body capable of propagating acoustic wave signals on one surface thereof in response to a reference signal, a semiconductor device having one surface spaced a predetermined distance from said one surface of the piezoelectric body, said semiconductor including a layer of one semiconductivity type and a material of the opposite semiconductivity type to form a matrix of PN junctions opposing the said one surface of the piezoelectric body, a metallic electrode overlying the opposite surface of the semiconductor device to provide a signal for the semiconductor device in response to the write signal, and transducer means for applying a reference acoustic wave to the piezoelectric body in response to the reference signal.

12. A device according to claim 11 wherein the diode PN junctions have center to center spacing no greater than one-eighth the acoustical surface wavelength for the highest selected frequency of the piezoelectric body.

13. A device according to claim 11 wherein the opposing surfaces of the semiconductor device and the piezoelectric body are spaced to maintain an air gap therebetween of approximately 500 to 10,000 angstroms.

14. A device according to claim 11 wherein the semiconductor device further includes a layer of semiconductor material of the opposite semiconductivity type between the summing electrode and the substrate of the one semiconductivity type to form a PN junction, and means for applying a pulse across said PN junction to forward bias said PN junction for erasing a signal stored in the semiconductor device.

15. An acousto-elecric device for storing a reference signal in relation to a write pulse, said device comprising:

piezoelectric means for providing an electric field in relation to an acoustic wave;

a first electrode array for providing a current in relation to the electric field of said piezoelectric means;

electrical conductors for transferring the current provided by said first electrode array;

a second electrode array for applying an electric field in relation to the current transferred by said conductor; and semiconductor means for providing a space-charge region in relation to said write pulse and in relation to said electric field of said second electrode array.

16. The apparatus of claim 15 including:

a reference signal transducer for providing an acoustic wave on the surface of said piezoelectric means in relation to said reference signal; and a ground electrode attached to said piezoelectric means such that the electric field developed by said acoustic wave is relative to ground potential.

17. The apparatus of claim 16 in which said semiconductor means is comprised of:

a p type material having a concentration of charge carriers; and an n+ type material having a concentration of charge carriers.

18. The apparatus of claim 17 including:

a summing electrode for providing an output signal in relation to said space-charge region of said semiconductor means.

19. The apparatus of claim 18 in which said summing electrode includes:

a write terminal for providing said write pulse to said summing electrode.

20. An acousto-electric device for storing a reference signal in relation to a write pulse, said device comprising:

piezoelectric means for providing an electric field in relation to an acoustic wave;

an electrode array for providing a current in relation to the electric field of said piezoelectric means;

electrical conductors for transferring the current provided by said electrode array; and a metal-oxide-silicon capacitor for providing a space-charge region in relation to said write pulse and in relation to said current transferred by said electrical conductors.

21. The apparatus of claim 20 in which said metal-oxide-silicon capacitor includes:

a first plate comprised of an electrode array;

a dielectric comprised of an oxide layer; and a second plate comprised of a semiconductor material.

22. The apparatus of claim 21 in which said semiconductor of said second plate is comprised of a p type material having a concentration of charge carriers.

23. The apparatus of claim 20 including:

a summer electrode for providing an output signal in relation to said space-charge region of said metal-oxide-silicon capacitor.

24. The apparatus of claim 23 in which said summing electrode includes:

a write terminal for providing said write pulse to said summing electrode.

* * * * *